(12) United States Patent
Miyake

(10) Patent No.: US 12,132,123 B2
(45) Date of Patent: Oct. 29, 2024

(54) P-TYPE GALLIUM OXIDE SEMICONDUCTOR DEVICE WITH ALTERNATING LAYERS

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Hiroki Miyake, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

(*) Notice: Subject to any disclaimer, the term of this patent is extended or adjusted under 35 U.S.C. 154(b) by 213 days.

(21) Appl. No.: 17/398,129

(22) Filed: Aug. 10, 2021

(65) Prior Publication Data

US 2022/0115544 A1    Apr. 14, 2022

(30) Foreign Application Priority Data

Oct. 9, 2020    (JP) .................................. 2020-171432

(51) Int. Cl.
*H01L 29/86*    (2006.01)
*H01L 21/02*    (2006.01)
(Continued)

(52) U.S. Cl.
CPC .... *H01L 29/8611* (2013.01); *H01L 21/02414* (2013.01); *H01L 21/02483* (2013.01);
(Continued)

(58) Field of Classification Search
CPC .......... H01L 29/8611; H01L 21/02414; H01L 21/02483; H01L 21/02565;
(Continued)

(56) References Cited

U.S. PATENT DOCUMENTS 5,268,582 A * 12/1993 Kopf ................. H01L 21/02631
257/E29.093
2011/0127579 A1 6/2011 Yamazaki
(Continued)

FOREIGN PATENT DOCUMENTS

JP    2008-098298 A    4/2008
JP    2013-056804 A    3/2013
(Continued)

OTHER PUBLICATIONS

Liu et al., Fabrication and characteristics of N-doped β-Ga2O3 nanowires. Appl. Phys. A 98, 831-835 (2010). https://doi.org/10.1007/s00339-009-5538-y (Year: 2010).*

(Continued)

*Primary Examiner* — Didarul A Mazumder
(74) *Attorney, Agent, or Firm* — Posz Law Group, PLC

(57) ABSTRACT

A semiconductor device includes: a p-type region including a super-lattice pseudo mixed crystal region in which a first layer and a second layer are alternately stacked. The first layer includes a gallium oxide based semiconductor. The second layer includes a p type semiconductor made of a material different from the first layer.

23 Claims, 6 Drawing Sheets

(51) Int. Cl.
    *H01L 29/861*     (2006.01)
    *H01L 31/0352*     (2006.01)

(52) U.S. Cl.
    CPC ............... *H01L 21/02565* (2013.01); *H01L 31/035236* (2013.01)

(58) Field of Classification Search
    CPC ....... H01L 21/02507; H01L 31/035236; H01L 21/02472; H01L 21/02579; H01L 29/151; H01L 29/24; H01L 29/861; H01L 29/12
    USPC .......................................................... 257/76
    See application file for complete search history.

(56) References Cited

U.S. PATENT DOCUMENTS

| | | | |
|---|---|---|---|
| 2011/0309374 A1* | 12/2011 | Wang | H01L 33/40 438/46 |
| 2019/0051794 A1* | 2/2019 | Atanackovic | H01L 33/10 |
| 2020/0020814 A1 | 1/2020 | Miyake et al. | |
| 2020/0168711 A1 | 5/2020 | Sasaki | |
| 2021/0351321 A1* | 11/2021 | Atanackovic | H01L 21/02414 |

FOREIGN PATENT DOCUMENTS

| | | | |
|---|---|---|---|
| JP | 2015-140263 A | 8/2015 |
| JP | 2018-170509 A | 11/2018 |
| JP | 2019-192871 A | 10/2019 |
| JP | 6627138 B2 | 1/2020 |

OTHER PUBLICATIONS

Chikoidze et al., P-type β-gallium oxide: A new perspective for power and optoelectronic devices, Materials Today Physics, vol. 3, 118-126 (2017). https://www.sciencedirect.com/science/article/pii/S2542529317301712 (Year: 2017).*

Tang et al., Electronic structure and optical property of metal-doped Ga2O3: a first principles study, RSC Advances, vol. 6, 78322-78334 (2016). https://pubs.rsc.org/en/content/articlelanding/2016/ra/c6ra14010f (Year: 2016).*

Liu etal., Fabrication and characteristics of N-doped f3-Ga2O3 nanowires. Appl. Phys. A 98, 831-835 (2010). https://doi.org/10.1007/s00339-009-5538-y (Year: 2010) (Year: 2010).*

Chikoidze et al., P-type [3-gallium oxide: A new perspective for power and optoelectronic devices, Materials Today Physics, vol. 3, 118-126 (2017). https://www .sciencedirect.com/science/article/pii/S2542529317301712 (Year: 2017) (Year: 2017).*

Tang et al., Electronic structure and optical property of metal-doped Ga2O3: a first principles study, RSC Advances, vol. 6, 78322-78334 (2016). https://pubs.rsc.org/en/content/articlelanding/2016/ra/c6ra1401 Of (Year: 2016) (Year: 2016).*

Liu etal., Fabrication and characteristics of N-doped f3-Ga2O3 nanowires. Appl. Phys. A 98, 831-835 (2010). https://doi.org/10.1007/s00339-009-5538-y (Year: 2010).*

Chikoidze et al., P-type [3-gallium oxide: A new perspective for power and optoelectronic devices, Materials Today Physics, vol. 3, 118-126 (2017). https://www .sciencedirect.com/science/article/pii/S2542529317301712 (Year: 2017).*

Tang et al., Electronic structure and optical property of metal-doped Ga2O3: a first principles study, RSC Advances, vol. 6, 78322-78334 (2016). https://pubs.rsc.org/en/content/articlelanding/2016/ra/c6ra1401 Of (Year: 2016).*

* cited by examiner

P-TYPE GALLIUM OXIDE SEMICONDUCTOR DEVICE WITH ALTERNATING LAYERS

CROSS REFERENCE TO RELATED APPLICATION

The present application claims the benefit of priority from Japanese Patent Application No. 2020-171432 filed on Oct. 9, 2020. The entire disclosure of the above application is incorporated herein by reference.

TECHNICAL FIELD

The techniques disclosed herein relate to a semiconductor device made of a gallium oxide semiconductor.

BACKGROUND

Semiconductor devices manufactured using gallium oxide-based semiconductors are expected to exhibit high withstand voltage, low loss, and high heat resistance. A conceivable technique teaches an example of a semiconductor device manufactured by using a gallium oxide-based semiconductor.

SUMMARY

According to an example, a semiconductor device includes: a p-type region including a super-lattice pseudo mixed crystal region in which a first layer and a second layer are alternately stacked. The first layer includes a gallium oxide based semiconductor. The second layer includes a p type semiconductor made of a material different from the first layer.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
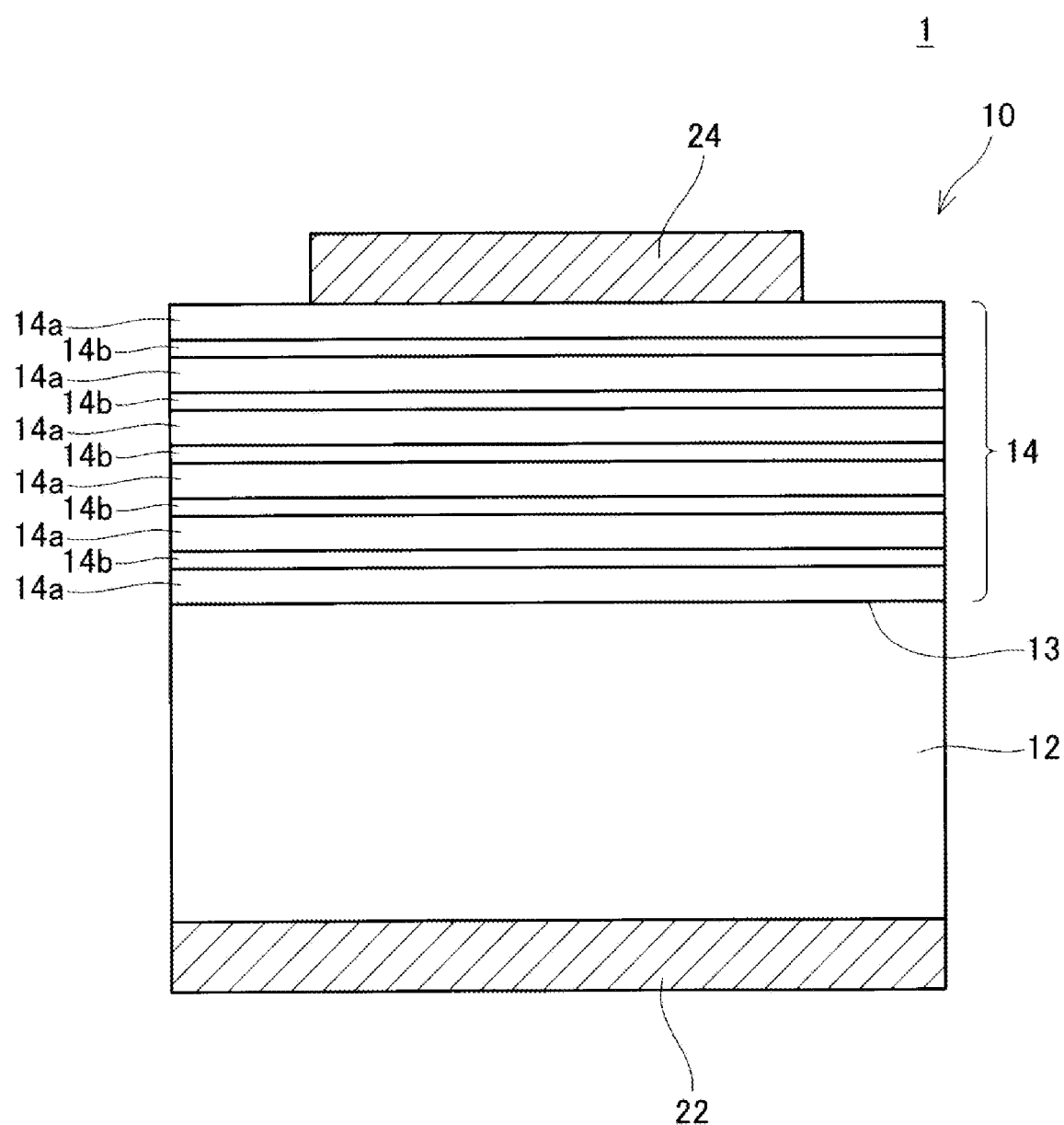
FIG. 1 is a diagram schematically showing a cross-sectional view of a main part of the semiconductor device of the first embodiment.

As pointed out in the conceivable technique, a technique for forming a highly active p-type gallium oxide-based semiconductor has not yet been established, and a semiconductor device having a p-type region with excellent conductivity is not manufactured. In view of this, a semiconductor device is provided to have a p-type region with excellent conductivity in a semiconductor device manufactured by using a gallium oxide-based semiconductor.

The semiconductor device in the present embodiments includes a p-type region with a region made of a superlattice pseudo-mixed crystal in which the first layer and the second layer are alternately stacked. The first layer is made of a gallium oxide-based semiconductor. The second layer is a p-type semiconductor made of a material different from that of the first layer.

In the above semiconductor device, the p-type region is made of a superlattice pseudo-mixed crystal in which gallium oxide-based semiconductors and p-type semiconductors are alternately stacked. Therefore, the thickness of each of the gallium oxide-based semiconductor and the p-type semiconductor is thin enough to have the characteristics of superlattice pseudo-mixed crystals. Therefore, since these thicknesses are thin enough to allow the hole carriers to provide a tunnel effect, the entire p-type region can have p-type conductivity. As described above, the semiconductor device can be provided with a p-type region having excellent conductivity.

The technical elements disclosed herein are listed below. The following technical elements are useful independently.

The semiconductor device disclosed in the present embodiments can include a p-type region having a region made of a superlattice pseudo-mixed crystal in which a first layer and a second layer are alternately stacked. The first layer is made of a gallium oxide-based semiconductor. The gallium oxide-based semiconductor includes gallium oxide and gallium oxide in which some atomic sites are replaced with other atoms. The second layer is a p-type semiconductor made of a material different from that of the first layer. The crystal structure of the second layer is not particularly limited, and various semiconductors having p-type conductivity can be used for the second layer. For example, the crystal structure of the second layer may include at least one selected from the group of N, Mg, Zn, Ni, Cu, Rh, Ir, Cr, Fe, Co, Li, Bi, In, Al, Ga, P, Mn, As, Sb, S, and Se. The second layer including these atoms has a crystal structure for which a technique for forming a highly active p-type has been established.

The second layer may be made of a p-type oxide semiconductor or a p-type non-oxide Ga-based semiconductor. When the second layer is made of the oxide semiconductor, the second layer may include at least one selected from the group of NiO, $Cu_2O$, $Rh_2O_3$, $Ir_2O_3$, $Cr_2O_3$, ZnMgO, ZnO, $ZnGa_2O_4$, $ZnRh_2O_4$, $Fe_2O_3$, $ZnCo_2O_4$, $Li_2O$, $Bi_2O_3$, $In_2O_3$, and $Mn_2O_3$. When the second layer is made of a non-oxide Ga-based semiconductor, the second layer may include at least one selected from the group of GaN, GaP, GaAs, GaSb, $CuGaS_2$, and $Ga_2Se_3$. The bandgap width of these exemplified materials is narrower than the bandgap width of the gallium oxide-based semiconductor in the first layer. Generally, when the bandgap width is narrow, it tends to have p-type conductivity. Therefore, for example, when only these exemplified materials are used, a region having excellent p-type conductivity can be formed. Here, the region formed only by these exemplified materials has a narrow bandgap width and a low dielectric breakdown electric field strength. In the semiconductor device of the present embodiment, the p-type region includes a region made of the superlattice pseudo-mixed crystal in the first layer and the second layer. Therefore, the bandgap width of the p-type region is provided by a bandgap width between the bandgap width of the material of the first layer and the bandgap width of the material of the second layer. Therefore, the p-type region can have a wide bandgap width and a high dielectric breakdown electric field strength as compared with the case where the p-type region includes only the second layer (that is, only the materials exemplified above).

The semiconductor device may further include an n-type region in contact with the p-type region. Since the p-type region has a high dielectric breakdown electric field strength, the breakdown at the pn junction surface between the p-type region and the n-type region can be suppressed. The semiconductor device of such an embodiment can have high withstand voltage characteristics.

In the semiconductor device, the pseudo-mixed crystal ratio, which is the ratio of the first layer to the unit volume of the p-type region, may decrease monotonically as the distance from the n-type region increases. For example, the thickness of the first layer may decrease as the distance from the n-type region increases. Alternatively or additionally, the thickness of the second layer may increase as it moves away from the n-type region. The pseudo-mixed crystal ratio of the first layer and the second layer is adjusted according to the electric field distribution in the p-type region, and the semiconductor device of such an embodiment achieves both high withstand voltage and low resistance.

At the pn junction boundary between the p-type region and the n-type region, the first layer of the p-type region may be in contact with the n-type region. The breakdown at the pn junction boundary between the p-type region and the n-type region is suppressed. The semiconductor device of such an embodiment can have high withstand voltage characteristics.

Hereinafter, the technique disclosed in the present embodiments will be described according to a diode in which the technique disclosed in the present embodiments are applied to the p-type anode region as an example. However, the technique disclosed in the present embodiments is not limited to the type of semiconductor device, and can be applied to various p-type regions included in each semiconductor device. As an example, the techniques disclosed herein are applicable to p-type regions of MOSFETs and IGBTs (e.g., body regions and guard ring regions).

First Embodiment

As shown in FIG. 1, the diode 1 includes a semiconductor substrate 10, a cathode electrode 22 provided so as to cover the lower surface of the semiconductor substrate 10, and an anode electrode 24 to cover a part of the upper surface of the semiconductor substrate 10. The semiconductor substrate 10 has an n-type cathode region 12 and a p-type anode region 14. The diode 1 is a pn junction diode in which an n-type cathode region 12 and a p-type anode region 14 form a pn junction surface 13, and has a rectifying function for flowing a current only from the anode electrode 24 to the cathode electrode 22. The cathode region 12 is an example of an n-type region, and the anode region 14 is an example of a p-type region.

The cathode region 12 is exposed on the lower surface of the semiconductor substrate 10 and is in ohmic contact with the cathode electrode 22. The crystal structure of the cathode region 12 is made of a gallium oxide ($Ga_2O_3$). The crystal phase is not particularly limited, alternatively, may be, for example, an a phase or a β phase. Further, the gallium site or oxygen site may be replaced with another atom. For example, the crystal structure of the cathode region 12 may be made of $(InAlGa)_2O_3$.

The anode region 14 is provided on the surface of the cathode region 12, is exposed on the upper surface of the semiconductor substrate 10, and is in ohmic contact with the anode electrode 24. The anode region 14 has a plurality of first layers 14a and a plurality of second layers 14b, and the first layers 14a and the second layers 14b are alternately stacked. The first layers 14a and the second layers 14b are formed by alternately growing crystals from the surface of the anode region 14 by using a known crystal growth technique. As a known crystal growth technique, for example, a CVD method (including a mist CVD method) or an MBE method may be used.

The first layer 14a is made of a gallium oxide-based semiconductor. For example, the crystal structure of the first layer 14a is made of gallium oxide ($Ga_2O_3$). The crystal phase is not particularly limited, alternatively, may be, for example, an a phase or a β phase. Further, the gallium site or oxygen site may be replaced with another atom. For example, the crystal structure of the first layer 14a may be made of $(InAlGa)_2O_3$.

The first layer 14a is undoped or p-type. When the first layer 14a is p-type, the dopants introduced into the first layer 14a includes at least one selected from a group consisting of N, Mg, Zn, Ni, Cu, Rh, Ir, Cr, Fe, Co, Li, Bi, H, Be, Na, P, S, K, Ca, Mn, As, Se, Rb, Sr, Ru, Pd, Ag, Cd, Sb, Te, Cs, Ba, Pt, Au, Hg, Tl, Pb, Po, Fr, and Ra. The dopant may be introduced during crystal growth or may be introduced after crystal growth using ion implantation techniques. The technique for forming highly active p-type gallium oxide has not yet been established. Therefore, the activation rate of the dopant included in the first layer 14a is low.

The crystal structure of the second layer 14b is a metal oxide semiconductor or a non-oxide Ga-based semiconductor including at least one selected from the group of N, Mg, Zn, Ni, Cu, Rh, Ir, Cr, Fe, Co, Li, Bi, In, Al, Ga, P, Mn, As, Sb, S, and Se. As the material of the second layer 14b, a metal oxide semiconductor or a non-oxide Ga-based semiconductor for which a technique for forming a highly active p-type has been established is adopted. Therefore, the second layer 14b is a highly active p-type. The dopant may be introduced during crystal growth or may be introduced after crystal growth using ion implantation techniques.

When the second layer 14b is made of the metal oxide semiconductor, the second layer 14b may include at least one selected from the group of NiO, $Cu_2O$, $Rh_2O_3$, $Ir_2O_3$, $Cr_2O_3$, ZnMgO, ZnO, $ZnGa_2O_4$, $ZnRh_2O_4$, $Fe_2O_3$, $ZnCo_2O_4$, $Li_2O$, $Bi_2O_3$, $In_2O_3$, and $Mn_2O_3$. When the second layer 14b is a non-oxide Ga-based semiconductor, the second layer 14b may include at least one selected from the group of GaN, GaP, GaAs, GaSb, $CuGaS_2$, and $Ga_2Se_3$.

The thickness of each of the first layer 14a and the second layer 14b (i.e., the thickness in the stacking direction, and the thickness in the vertical direction of the drawing surface) is formed extremely thin. Therefore, the anode region 14 formed by alternately stacking the first layer 14a and the second layer 14b has a characteristic of superlattice pseudo-mixed crystal. The thickness of each of the first layer 14a and the second layer 14b is not particularly limited as long as the characteristics as a superlattice pseudo-mixed crystal can be obtained, and for example, 5 nm or less, 4 nm or less, 3 nm or less, or 2 nm or less.

The superlattice pseudo-mixed crystal referred to in the present embodiment means a state in which the band gap of the anode region 14 including the first layer 14a and the second layer 14b made of different materials is recognized as one equivalent band gap. Specifically, when the anode region 14 is measured using the photoluminescence method, the anode region 14 is evaluated as a state of a superlattice pseudo-mixed crystal when there is one peak of light observed excluding the effects of crystal defects and impurities.

As described above, in the diode 1, the thicknesses of each of the first layer 14a and the second layer 14b constituting the anode region 14 is formed so thin as to have the characteristics of superlattice pseudo-mixed crystals. Therefore, since these thicknesses are so thin that the hole carriers can be tunneled, the entire anode region 14 can have p-type conduction. As described above, although the material of the first layer 14a constituting the anode region 14 is gallium oxide ($Ga_2O_3$), the material can substantially have p-type conduction. Since the diode 1 has an anode region 14 with excellent p-type conduction, it can operate with a low resistance.

Further, since the anode region 14 has the characteristic of superlattice pseudo-mixed crystal, it can have the following characteristics. The bandgap width of the anode region 14 of the superlattice pseudo-mixed crystal is a level between the bandgap width of the first layer 14a and the bandgap width of the second layer 14b. For example, when the first layer 14a is made of β-gallium oxide (β-$Ga_2O_3$), its bandgap width is 4.5 eV to 4.9 eV. The bandgap width of the second layer 14b varies depending on the metal oxide semiconductor used, but it is narrower than the bandgap width of the first layer 14a. For example, when the second layer 14b is made of nickel oxide (NiO), its bandgap width is narrower than 4eV. When the first layer 14a is β-gallium oxide (β-$Ga_2O_3$) and the second layer 14b is nickel oxide (NiO), the bandgap width of the anode region 14 of the superlattice pseudo mixed crystal is 4 eV or more.

As described above, since the anode region 14 is made of a superlattice pseudo-mixed crystal of the first layer 14a and the second layer 14b, the bandgap width is wider and the dielectric breakdown electric field strength is higher than in the case of configuration where the anode region 14 is made of only the second layer 14b (that is, made of only nickel oxide (NiO). As a result, the diode 1 can have high withstand voltage characteristics.

Figure 2:
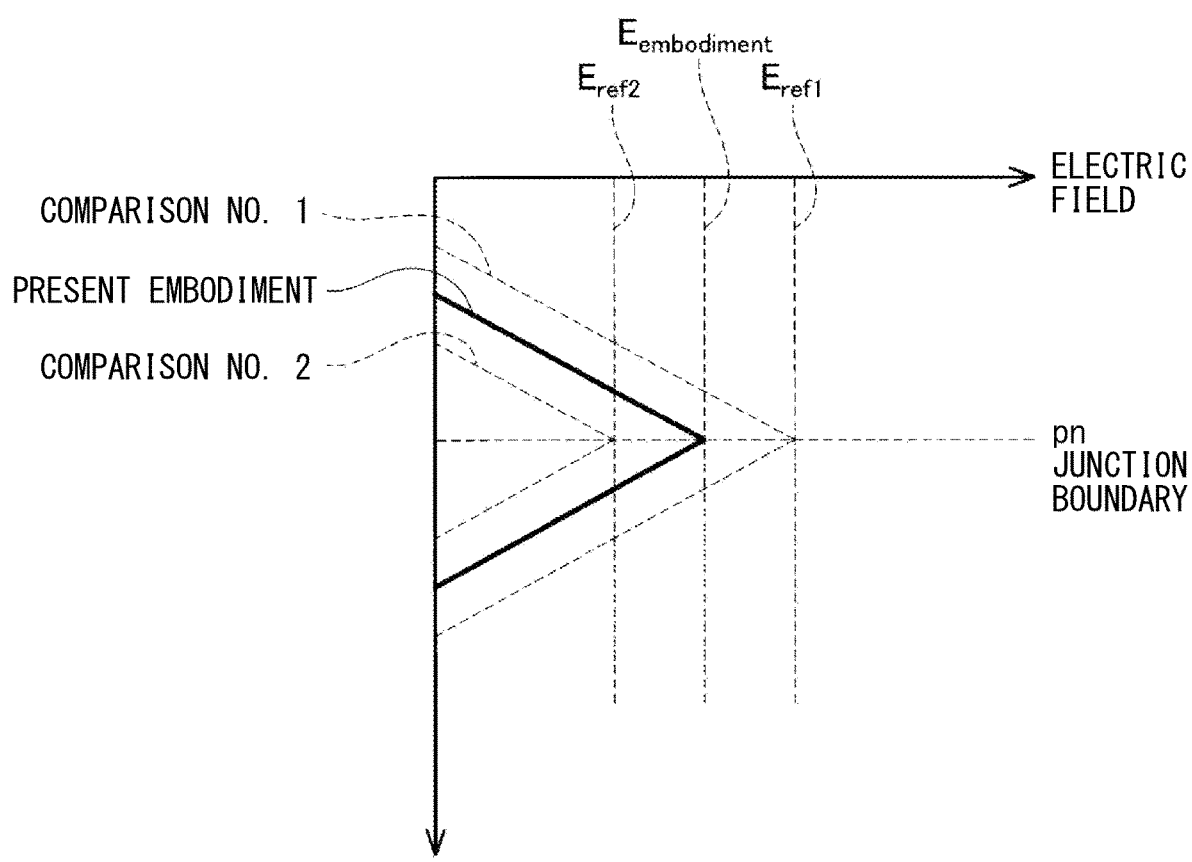
FIG. 2 is a diagram schematically showing an electric field distribution near a pn junction boundary.

FIG. 2 schematically shows the electric field distribution in the vicinity of the pn junction surface of the diode 1 according to the present embodiment and comparative Examples 1 and 2. The upper side of the pn junction corresponds to the range of the anode region 14, and the lower side of the pn junction corresponds to the range of the cathode region 12. Comparative Example 1 is an example in which the entire anode region 14 is made of only the material of the first layer 14a (that is, an example in which the entire anode region 14 is made of only β-gallium oxide (β-$Ga_2O_3$)). Comparative Example 2 is an example in which the entire anode region 14 is made of only the material of the second layer 14b (that is, the entire anode region 14 is made of only nickel oxide (NiO)). As for Comparative Example 1, since the technique for forming highly active p-type gallium oxide has not been established yet, such a diode cannot be realized at present.

$E_{ref1}$, $E_{ref2}$, and $E_{embodiment}$ show the dielectric breakdown strengths of Comparative Example 1, Comparative Example 2, and the present embodiment, respectively. In Comparative Example 1, since the material used for the anode region 14 is β-gallium oxide (β-$Ga_2O_3$) having a wide bandgap, the dielectric breakdown strength $E_{ref1}$ is high. In Comparative Example 2, since the material used for the anode region 14 is nickel oxide (NiO) having a narrow bandgap width, the dielectric breakdown strength $E_{ref2}$ is low. In the present embodiment, since the material used for the anode region 14 is a superlattice pseudo-mixed crystal of β-gallium oxide (β-$Ga_2O_3$) and nickel oxide (NiO), the dielectric breakdown strength $E_{embodiment}$ is between $E_{ref1}$ and $E_{ref2}$.

In this type of diode, the electric field strength peaks at the pn junction surface. Therefore, breakdown occurs when the electric field of the pn junction surface exceeds the dielectric breakdown strength. Since Comparative Example 1 has the highest dielectric breakdown strength $E_{ref1}$, the voltage that can be held between the anode and the cathode (that is the integrated value between the anode and the cathode of the electric field distribution, which corresponds to the area of the triangle of the electric field distribution) is large. However, Comparative Example 1 is a diode that cannot be manufactured at this time. Comparative Example 2 has the lowest dielectric breakdown strength $E_{ref2}$, so that the voltage that can be held is small. Therefore, Comparative Example 2 cannot have high withstand voltage characteristics. This embodiment has a dielectric breakdown strength $E_{embodiment}$ higher than that of Comparative Example 2. Therefore, the present embodiment can have a characteristic of higher withstand voltage than that of Comparative Example 2.

As described above, the anode region 14 of the diode 1 is made of a superlattice pseudo-mixed crystal formed by alternately stacking a first layer 14a having a wide bandgap and a second layer 14b having excellent p-type conduction. Therefore, the material properties of the anode region 14 can have an equivalently wide bandgap and good p-type conduction. In the diode 1, by configuring the anode region 14 as a superlattice pseudo-mixed crystal, it is possible to achieve both high withstand voltage and low resistance.

Further, in the diode 1 of the present embodiment, the first layer 14a of the anode region 14 is located at the pn junction surface and is in contact with the n-type cathode region 12. Since the first layer 14a made of β-gallium oxide (β-$Ga_2O_3$) having a wide bandgap width is located so as to be in contact with the pn junction surface where the electric field is highest, the breakdown at the pn junction surface is suppressed. Therefore, the diode 1 can have a high withstand voltage characteristic.

Further, the diode 1 of the present embodiment has a feature that the crystallinity of the anode region 14 is good. For example, as in Comparative Example 2 described above, if the entire anode region 14 is made of only nickel oxide (NiO), the anode region 14 can have good p-type conduction. However, in such Comparative Example 2, the anode region 14 of nickel oxide (NiO) is a different material from the cathode region 12 of the underlying β-gallium oxide (β-$Ga_2O_3$). Therefore, in Comparative Example 2, the crystallinity of the anode region 14 formed on the cathode region 12 is not good, and the electrical characteristics may deteriorate. On the other hand, in the diode 1 of the present embodiment, since the anode region 14 is a superlattice pseudo-mixed crystal of β-gallium oxide (β-$Ga_2O_3$) and nickel oxide (NiO), the crystal structure of the anode region 14 is closer to the crystal structure of the cathode region 12. As a result, in the diode 1 of the present embodiment, the crystallinity of the anode region 14 formed on the cathode region 12 is good, and the electrical characteristics are good.

Second Embodiment

Figure 3:
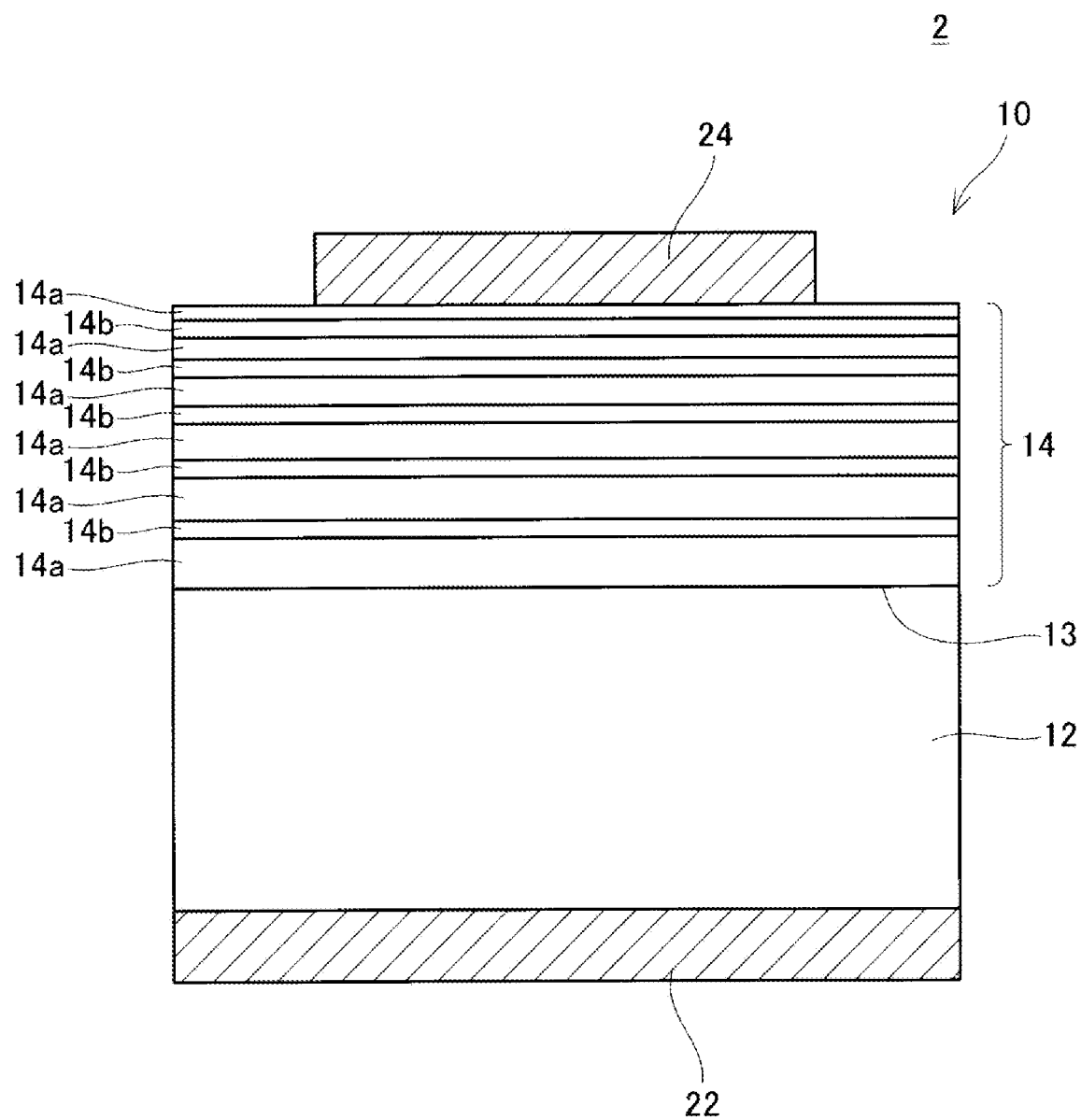
FIG. 3 is a diagram schematically showing a cross-sectional view of a main part of the semiconductor device of the second embodiment.

In the diode 2 shown in FIG. 3, the thickness of the first layer 14a is configured to decrease as the distance from the cathode region 12 increases. The thickness of each of the plurality of second layers 14b is the same. Therefore, the diode 2 is configured such that the pseudo-mixed crystal ratio, which is the ratio of the first layer 14a to the unit volume of the anode region 14, decreases monotonically as the distance from the cathode region 12 increases. Also in this example, the thickness of each of the first layer 14a and the second layer 14b is formed thin so that the anode region 14 has the characteristics of superlattice pseudo-mixed crystal.

As described with reference to FIG. 2, in this type of diode, the electric field strength peaks at the pn junction surface between the cathode region 12 and the anode region 14, and the electric field distribution in the anode region 14 decreases as the distance from the pn junction surface increases. In the diode 2 shown in FIG. 3, the thickness of the first layer 14a is formed to be large on the side close to the cathode region 12 where the electric field strength is high in response to such an electric field distribution, and the thickness of the first layer 14a is formed to be small on the side far from the cathode region 12 where the electric field strength is low. Since the pseudo mixed crystal ratio of the first layer 14a is largely adjusted on the side close to the cathode region 12, the diode 2 can have a high withstand voltage characteristic. Further, since the pseudo-mixed crystal ratio of the first layer 14a is small on the side far from the cathode region 12, in other words, the pseudo-mixed crystal ratio of the second layer 14b is greatly adjusted, the diode 2 has a low resistance characteristic. In this way, the diode 2 can improve the trade-off relationship between high withstand voltage and low resistance.

The diode 2 shown in FIG. 3 is configured such that the pseudo mixed crystal ratio of the first layer 14a decreases monotonically as the distance from the cathode region 12 increases, and the thickness of the first layer 14a decreases as the distance from the cathode region 12 increases. Instead of this example, the thickness of each of the plurality of first layers 14a may be the same, but the thickness of the second layer 14b may be increased as the distance from the cathode region 12 increases. Alternatively, the thickness of the first layer 14a may decrease as the distance from the cathode region 12 increases, and the thickness of the second layer 14b may increase as the distance from the cathode region 12 increases. The thickness of each of the first layer 14a and the second layer 14b can be appropriately adjusted as long as the pseudo mixed crystal ratio of the first layer 14a decreases monotonically as the distance from the cathode region 12 increases.

Third Embodiment

Figure 4:
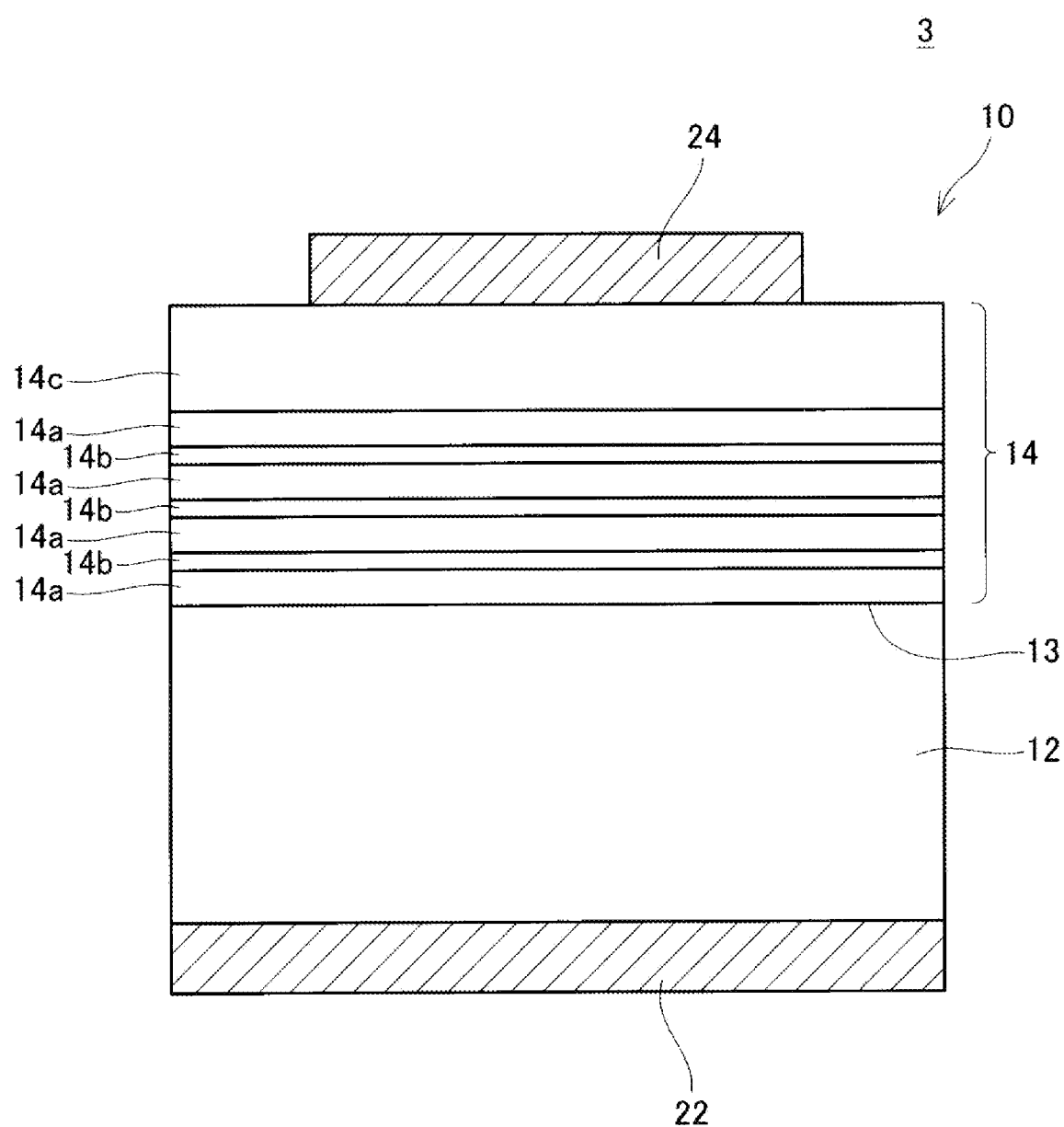
FIG. 4 is a diagram schematically showing a cross-sectional view of a main part of the semiconductor device of the third embodiment.

The diode 3 shown in FIG. 4 is characterized in that the anode region 14 further includes a p-type cap layer 14c. The cap layer 14c is provided on the uppermost surface of the anode region 14, is exposed on the upper surface of the semiconductor substrate 10, and is in ohmic contact with the anode electrode 24. The cap layer 14c is made of the same material as the second layer 14b (for example, nickel oxide (NiO)). Therefore, the cap layer 14c is a highly active p-type. The thickness of the cap layer 14c is relatively large, and does not form a superlattice pseudo-mixed crystal together with the first layer 14a and the second layer 14b. The cap layer 14c is sufficiently separated from the cathode region 12 and is arranged corresponding to the region where the electric field is small. The diode 3 provided with such a cap layer 14c can have low resistance characteristics.

Fourth Embodiment

Figure 5:
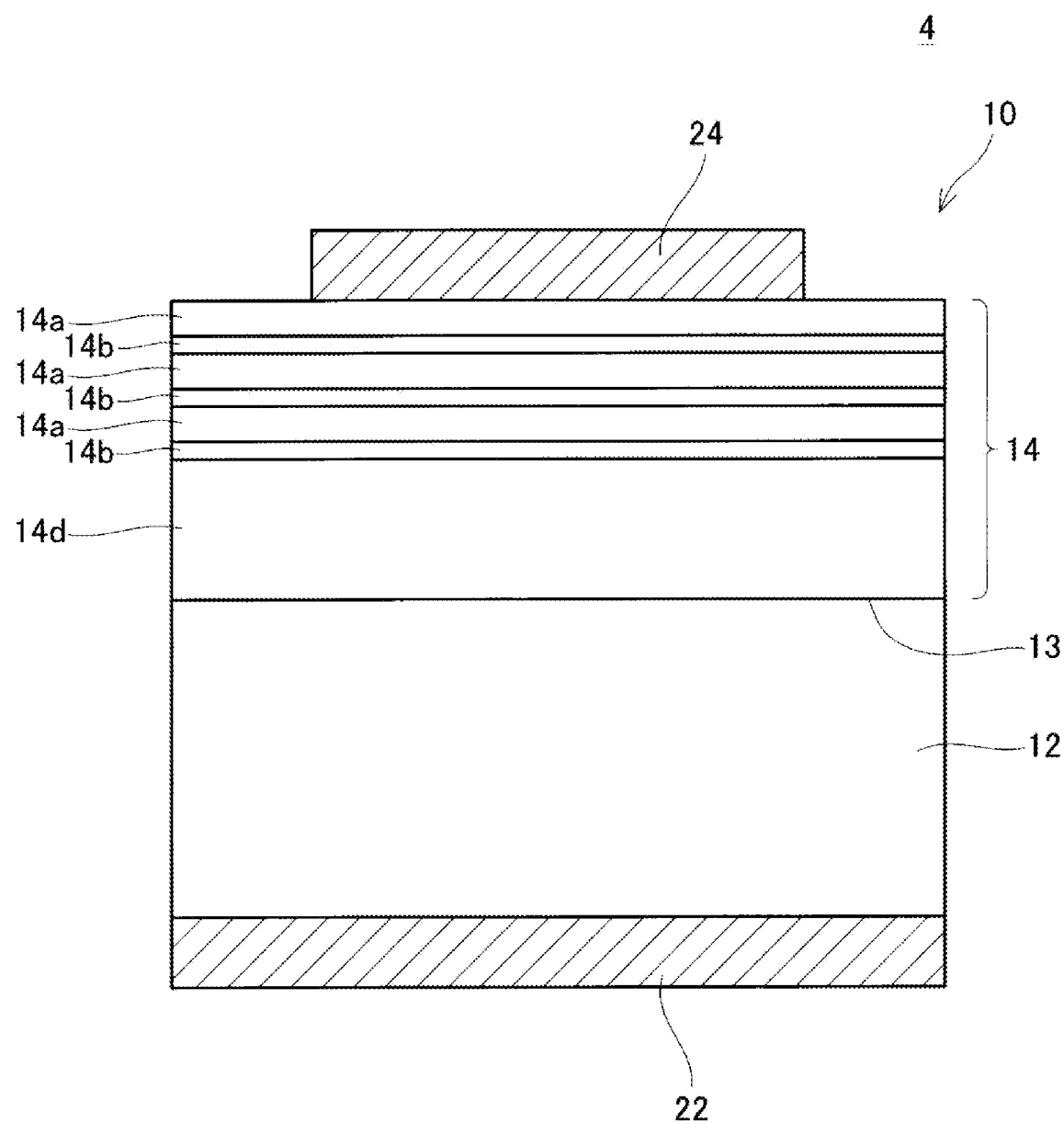
FIG. 5 is a diagram schematically showing a cross-sectional view of a main part of the semiconductor device of the fourth embodiment.

The diode 4 shown in FIG. 5 is characterized in that the anode region 14 further includes an undoped or p-type spacer layer 14d. The spacer layer 14d is provided between the cathode region 12 and the anode region 14. The spacer layer 14d is provided on the lowermost surface of the anode region 14 and is in contact with the cathode region 12. The spacer layer 14d is made of the same material as the first layer 14a (for example, β-gallium oxide (β-$Ga_2O_3$)). The thickness of the spacer layer 14d is relatively large, and does not form a superlattice pseudo-mixed crystal together with the first layer 14a and the second layer 14b. In the technique disclosed herein, a region of superlattice pseudo mixed crystals is formed in the anode region 14, so that a heterojunction surface in which different types of materials are bonded is formed. In the diode 4, since the spacer layer 14d is provided, the heterojunction surface is located at a position separated from the pn junction surface 13 of the cathode region 12 and the anode region 14. Since a heterojunction surface having many interface states is formed at a position away from the pn junction surface where the electric field strength is maximized, deterioration of electrical characteristics can be suppressed.

Fifth Embodiment

Figure 6:
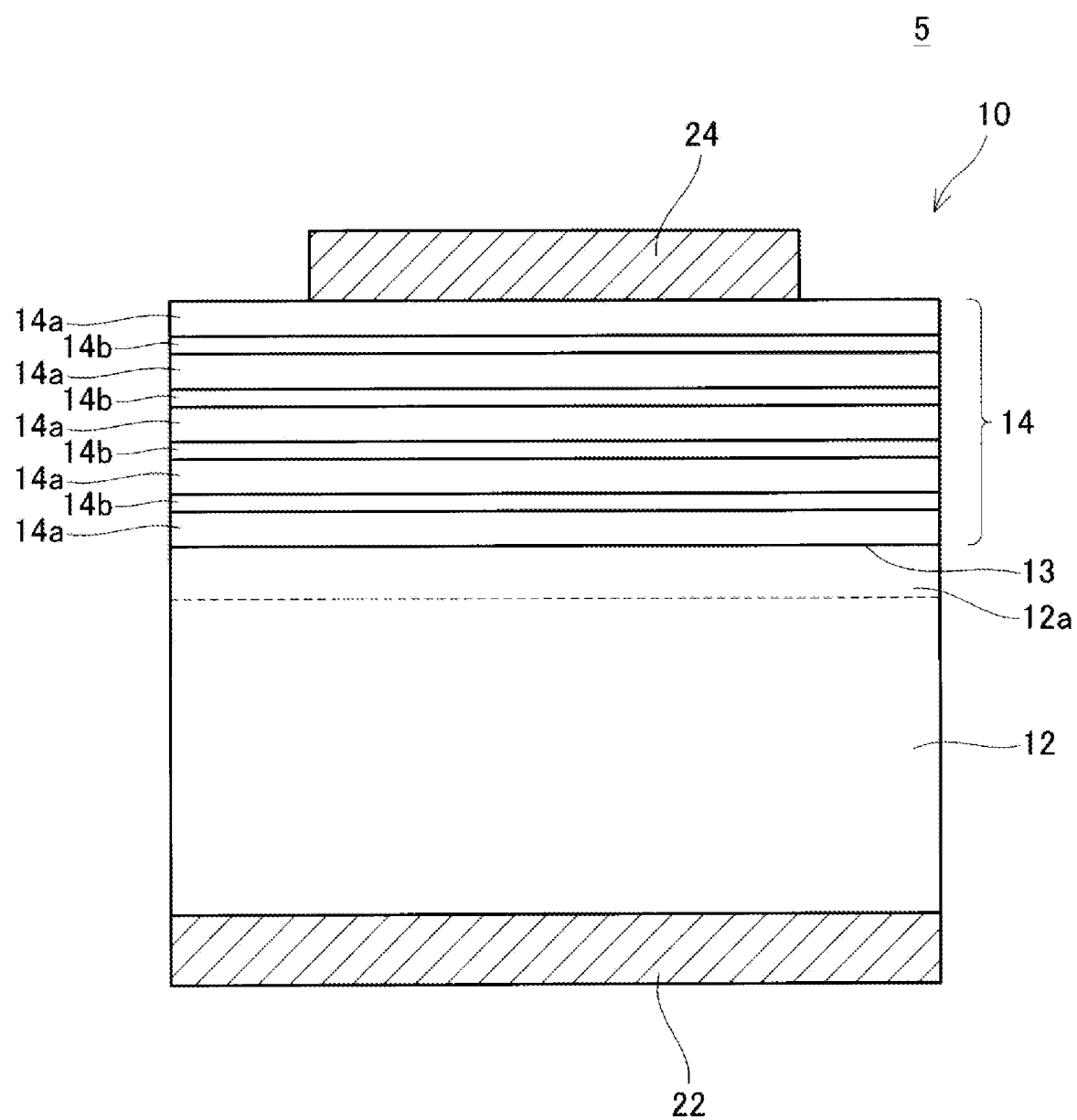
FIG. 6 is a diagram schematically showing a cross-sectional view of a main part of the semiconductor device of the sixth embodiment.

The diode 5 shown in FIG. 6 is characterized in that the cathode region 12 further includes a low concentration layer 12a. The low-concentration layer 12a is provided on the uppermost surface of the cathode region 12 and is in contact with the anode region 14. The low-concentration layer 12a is made of the same material as the other cathode regions 12, and has a lower carrier concentration than the other cathode regions 12. In this diode 5, the pn junction surface 13 between the cathode region 12 and the anode region 14 is also a heterojunction surface. However, since the low concentration layer 12a is provided, the leakage current through the interface state can be suppressed.

Although specific examples of the techniques disclosed in the present specification have been described in detail above, these are merely examples and do not limit the scope of claims. The techniques described in the claims include various modifications and modifications of the specific examples illustrated above. The technical elements described in the present specification or the drawings exhibit technical usefulness alone or in various combinations, and are not limited to the combinations described in the claims at the time of filing. The techniques illustrated in the present specification or drawings can achieve a plurality of objectives at the same time, and achieving one of the objectives itself has technical usefulness.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
   a p-type region including a superlattice pseudo-mixed crystal region in which a first layer and a second layer are alternately stacked, wherein:
   the first layer includes a gallium oxide-based semiconductor; and
   the second layer includes a p-type semiconductor made of a material different from the first layer, wherein the second layer is made of a p-type oxide semiconductor, and the second layer includes at least one selected from a group of NiO, $Cu_2O$, and $ZnGa_2O_4$,
wherein the superlattice pseudo-mixed crystal region indicates a state in which a band gap of the superlattice pseudo-mixed crystal region including the first layer and the second layer made of different materials is recognized as one equivalent band gap,
the semiconductor device further comprising: an n-type region, wherein:
the p-type region is in contact with the n-type region to provide a pn junction,
the n-type region further includes a low concentration layer;
the low concentration layer is disposed on an uppermost surface of the n-type region and is in contact with the p-type region; and
the low concentration layer is made of a same material as the n-type region, and has a lower carrier concentration than an other part of the n-type region.

2. The semiconductor device according to claim 1, wherein:
a crystal structure of the second layer includes at least one selected from a group of N, Mg, Zn, Ni, Cu, Rh, Ir, Cr, Fe, Co, Li, Bi, In, Al, Ga, P, Mn, As, Sb, S, and Se.

3. The semiconductor device according to claim 1, comprising at least two of the first layer alternating one-by-one with at least one of the second layer, wherein:
a pseudo-mixed crystal ratio, which is a ratio of the first layer to an unit volume of the p-type region, decreases monotonically as a distance from the n-type region increases.

4. The semiconductor device according to claim 3, wherein:
a thickness of the first layer decreases as the distance from the n-type region increases.

5. The semiconductor device according to claim 3, comprising at least two of the second layer, wherein:
a thickness of the second layer increases as the distance from the n-type region increases.

6. The semiconductor device according to claim 1, wherein:
the first layer of the p-type region is in contact with the n-type region at a pn junction boundary between the p-type region and the n-type region.

7. The semiconductor device according to claim 1, wherein:
a thickness of each of the first layer and the second layer is 5 nm or less.

8. The semiconductor device according to claim 7, wherein:
a thickness of each of the first layer and the second layer is 2 nm or less.

9. The semiconductor device according to claim 1, wherein:
the first layer is made of $\beta$-$Ga_2O_3$.

10. The semiconductor device according to claim 1, wherein:
the second layer includes Cu2O or ZnGa2O4.

11. The semiconductor device according to claim 1, wherein:
the p-type region further includes a p-type cap layer or an undoped or p-type spacer layer;
the p-type cap layer is disposed on an uppermost surface of the p-type region;
the p-type cap layer is made of a same material as the second layer;
the p-type cap layer does not provide the superlattice pseudo-mixed crystal region;
the spacer layer is disposed between the p-type region and the n-type region;
the spacer layer is disposed on a lowermost surface of the p-type region;
the spacer layer is made of a same material as the first layer; and
the spacer layer does not provide the superlattice pseudo-mixed crystal region.

12. A semiconductor device comprising:
a p-type region including a superlattice pseudo-mixed crystal region in which a first layer and a second layer are alternately stacked, wherein:
the first layer includes a gallium oxide-based semiconductor; and
the second layer includes a p-type semiconductor made of a material different from the first layer,
further comprising:
an n-type region in contact with the p-type region to provide a pn junction,
at least two of the first layer alternating one-by-one with at least one of the second layer, wherein:
a pseudo-mixed crystal ratio, which is a ratio of the first layer to an unit volume of the p-type region, decreases monotonically as a distance from the n-type region increases,
the superlattice pseudo-mixed crystal region indicates a state in which a band gap of the superlattice pseudo-mixed crystal region including the first layer and the second layer made of different materials is recognized as one equivalent band gap,
the second layer includes at least one selected from a group of NiO, $Cu_2O$, and $ZnGa_2O_4$,
the n-type region further includes a low concentration layer;
the low concentration layer is disposed on an uppermost surface of the n-type region and is in contact with the p-type region; and
the low concentration layer is made of a same material as the n-type region, and has a lower carrier concentration than an other part of the n-type region.

13. The semiconductor device according to claim 12, wherein:
a crystal structure of the second layer includes at least one selected from a group of N, Mg, Zn, Ni, Cu, Rh, Ir, Cr, Fe, Co, Li, Bi, In, Al, Ga, P, Mn, As, Sb, S, and Se.

14. The semiconductor device according to claim 13, wherein:
the second layer is made of a p-type oxide semiconductor or of a p-type non-oxide Ga-based semiconductor.

15. The semiconductor device according to claim 14, wherein:
when the second layer is made of the p-type oxide semiconductor, the second layer includes at least one selected from a group of NiO, $Cu_2O$, $Rh_2O_3$, $Ir_2O_3$, $Cr_2O_3$, ZnMgO, ZnO, $ZnGa_2O_4$, $ZnRh_2O_4$, $Fe_2O_3$, $ZnCo_2O_4$, $Li_2O$, $Bi_2O_3$, $In_2O_3$, and $Mn_2O_3$; and
when the second layer is made of the p-type non-oxide Ga-based semiconductor, the second layer includes at least one selected from a group of GaN, GaP, GaAs, GaSb, $CuGaS_2$, and $Ga_2Se_3$.

16. The semiconductor device according to claim 12, wherein:
a thickness of the first layer decreases as the distance from the n-type region increases.

17. The semiconductor device according to claim 12, comprising at least two of the second layer wherein:
a thickness of the second layer increases as the distance from the n-type region increases.

18. The semiconductor device according to claim 12, wherein:
the first layer of the p-type region is in contact with an n-type region at a pn junction boundary between the p-type region and the n-type region.

19. The semiconductor device according to claim 12, wherein:
a thickness of each of the first layer and the second layer is 5 nm or less.

20. The semiconductor device according to claim 19, wherein:
a thickness of each of the first layer and the second layer is 2 nm or less.

21. The semiconductor device according to claim 12, wherein:
the first layer is made of $\beta$-$Ga_2O_3$.

22. The semiconductor device according to claim 12, wherein:
the second layer includes $Cu_2O$ or $ZnGa_2O_4$.

23. The semiconductor device according to claim 12, wherein:
the p-type region further includes a p-type cap layer or an undoped or p-type spacer layer;
the p-type cap layer is disposed on an uppermost surface of the p-type region;
the p-type cap layer is made of a same material as the second layer;
the p-type cap layer does not provide the superlattice pseudo-mixed crystal region;
the spacer layer is disposed between the p-type region and the n-type region;
the spacer layer is disposed on a lowermost surface of the p-type region;
the spacer layer is made of a same material as the first layer; and
the spacer layer does not provide the superlattice pseudo-mixed crystal region.

* * * * *